(12) United States Patent
Saito et al.

(10) Patent No.: US 7,231,712 B2
(45) Date of Patent: Jun. 19, 2007

(54) METHOD OF MANUFACTURING A MODULE

(75) Inventors: Ryuichi Saito, Osaka (JP); Hiroshi Kagata, Osaka (JP); Masaaki Katsumata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/952,476

(22) Filed: Sep. 29, 2004

(65) Prior Publication Data

US 2005/0067177 A1    Mar. 31, 2005

(30) Foreign Application Priority Data

Sep. 29, 2003   (JP)   ............... 2003-337180

(51) Int. Cl.
  *H01R 43/00*   (2006.01)
(52) U.S. Cl. .............. 29/855; 29/25.41; 29/25.42; 29/830; 29/851; 29/852; 174/52.2; 174/255; 257/737
(58) Field of Classification Search ............... 29/855, 29/25.41, 25.42, 830, 851, 852; 174/52.2, 174/255; 257/737
See application file for complete search history.

(56) References Cited

U.S. PATENT DOCUMENTS 5,010,212 A    4/1991  Sumi et al.
6,521,997 B1    2/2003  Huang et al.
6,860,006 B2 *  3/2005  Sakai et al. ............... 29/852
2003/0173662 A1  9/2003  Oikawa

FOREIGN PATENT DOCUMENTS

| DE | 197 29 073 A1 | 1/1999 |
| JP | 3-205857 | 9/1991 |
| JP | 4-252041 | 9/1992 |
| JP | 08-181251 | 7/1996 |
| JP | 10-233463 | * 9/1998 |
| JP | 11-346056 A | 12/1999 |
| JP | 2001-244578 A | 9/2001 |

* cited by examiner

*Primary Examiner*—A. Dexter Tugbang
*Assistant Examiner*—Tim Phan
(74) *Attorney, Agent, or Firm*—McDermott Will & Emery LLP

(57) ABSTRACT

A module includes a ceramic substrate, first and second electrodes provided on the ceramic substrate, a component having third and fourth electrodes connected to the first and second electrodes, respectively, and a resin filled in a space between the component and the ceramic substrate. The ceramic substrate has a surface thereof having a recess formed therein. The first and second electrodes are provided on the surface of the ceramic substrate so that the recess is located between the first and second electrodes. The component is located over the recess and spaced from the ceramic substrate with a space including the recess. The space including the recess is filled with the resin. The module allows each component to be surface mounted at higher bonding strength, thus preventing short-circuit between the electrodes on the substrate and improving the operation reliability.

22 Claims, 7 Drawing Sheets

METHOD OF MANUFACTURING A MODULE

CROSS REFERENCE TO RELATED DOCUMENT

This application claims priority to Japanese Patent Application No. 2003-337180, filed on Sep. 29, 2003.

FIELD OF THE INVENTION

The present invention relates to a module including a ceramic substrate having a wiring pattern thereon, and electronic components, such as ICs, SAW filters, resistors, capacitors, and coils, mounted on the ceramic substrate, and to a method of manufacturing the module.

BACKGROUND OF THE INVENTION

Ceramic modules including electronic components, such as ICs, SAW filters, resistors, capacitors, and coils, mounted on a ceramic substrate having a wiring pattern thereon is disclosed in Japanese Patent Laid-Open Publication Nos. 3-205857 and 4-252041.

FIG. 18 is a cross sectional view of a conventional ceramic module 50. The ceramic module 50 includes a component 60, such as a capacitor and an inductor, an active component 80, such as an IC and a SAW filter, and a ceramic substrate 70. The ceramic substrate 70 includes internal electrodes 51, via electrodes 52 connecting between the internal electrodes 51, land electrodes 55 connected with the active component 80 and the component 60 for surface-mounting them, and back electrodes 56 for mounting the ceramic module 50 on a mother board. The end electrodes 62 of the component 60 are connected to land electrodes 55 corresponding to them with a conductive adhesive 61, such as solder, while the back electrodes 81 of the active component 80 are connected to land electrodes 55 corresponding to them with a conductive adhesive 61. A gap between the active component 80 and the substrate 70 is filled with a resin 90 for increasing reliability of surface mounting of the active component 80.

In the conventional module 50, the component 60 and the active component 80 are mounted on the ceramic substrate 70 which has been baked, and may be molded with a resin 91 according to requirement.

When the component 60 has a small size, such as 1005 size or 0603 size, the conventional module 50 includes a small amount of the conductive adhesive 61 for avoiding short-circuit between the electrodes during the surface mounting. When being applied for molding the component 60 mounted, the resin 91 may fail to flow into beneath the component 60, and may produce a gap 92. When the ceramic module 50 is mounted on the mother board, the conductive adhesive 61, such as solder, may melt and flow into the gap 92 between the component 60 and the ceramic substrate 70, hence causing a short-circuit between the land electrodes 55 and disturbing the performance and the operational reliability of the ceramic module 50.

The resin 90 is also applied to between the component 80 and the substrate 70 for mounting and securing the component 80 onto the substrate 70. The resin 90, upon not being applied sufficiently between the component 80 and the substrate 70, may reduce the bonding strength and the operational reliability.

SUMMARY OF THE INVENTION

A module includes a ceramic substrate, first and second electrodes provided on the ceramic substrate, a component having third and fourth electrodes connected to the first and second electrodes, respectively, and a resin filled in a space between the component and the ceramic substrate. The ceramic substrate has a surface thereof having a recess formed therein. The first and second electrodes are provided on the surface of the ceramic substrate so that the recess is located between the first and second electrodes. The component is located over the recess and spaced from the ceramic substrate with a space including the recess. The space including the recess is filled with the resin.

Accordingly, the module allows each component to be surface mounted at higher bonding strength, thus preventing short-circuit between the electrodes on the substrate and improving the operation reliability.

DETAILED DESCRIPTION OF THE PREFERRED EMBODIMENT

Figure 1:
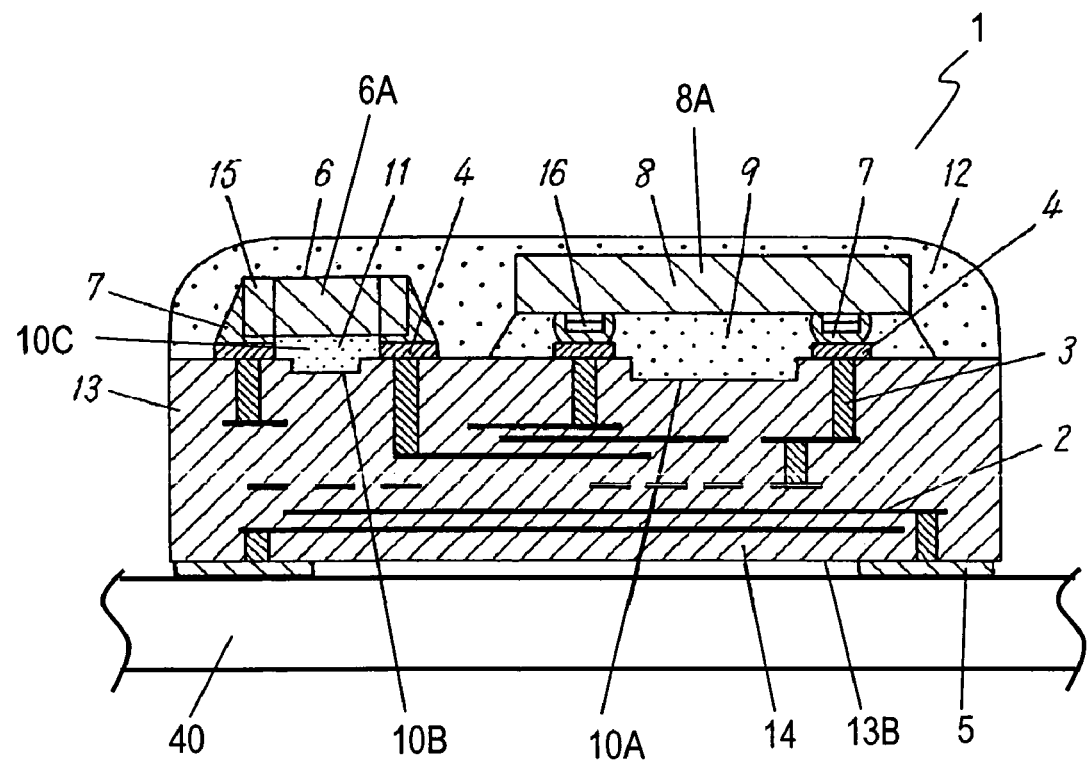
FIG. 1 is a cross sectional view of a ceramic module according to an exemplary embodiment of the present invention.
Figure 2:
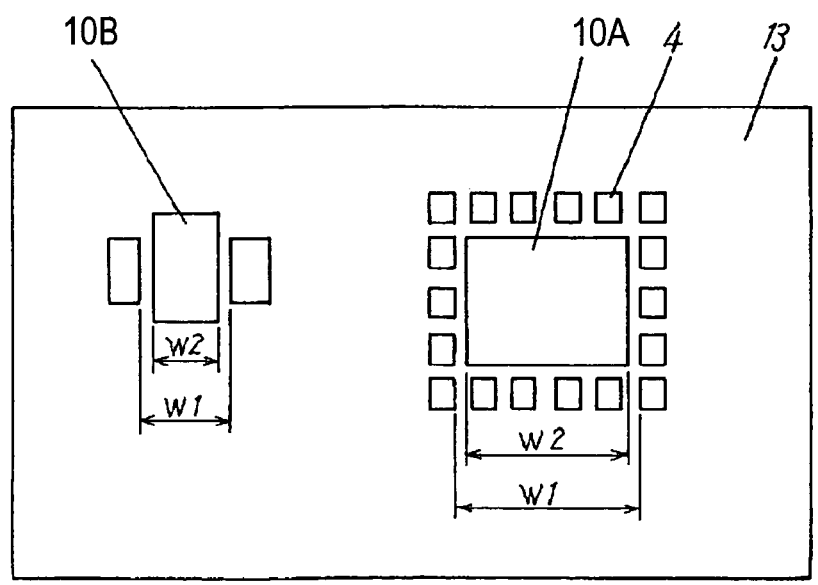
FIG. 2 is an upper view of a ceramic substrate of the ceramic module according to the embodiment.

FIG. 1 is a cross sectional view of a ceramic module 1 according to an exemplary embodiment of the present invention. FIG. 2 is an upper view of a ceramic substrate 13 of the module 1. The ceramic module 1 includes the ceramic substrate 13. The ceramic substrate 13 includes internal electrodes 2 provided as layers, via-electrodes 3 connecting between the internal electrodes 2, and a ceramic base 14 made of electrically-insulating material. A component 6, such as a chip resistor, a multi-layer ceramic capacitor, and a chip inductor, includes a main body 6A and end electrodes 15. An active component 8, such as an IC and a SAW filter, includes a main body 8A and bump electrodes 16. The end electrode 15 and the bump electrodes 16 are connected by solders 7 to land electrodes 4, and the components 6 and 8 are provided on the upper surface 13A of the substrate 13. Back electrodes 5 are provided on the lower surface 13B of the ceramic substrate 13 for allowing the ceramic module 1 to be mounted on a mother board 40. The ceramic substrate 13 has a recess 10B in a portion of the surface of substrate 13 facing the component 6, and has a recess 10A in a portion of the surface of substrate 13 facing the component 8. An insulating resin 11, such as epoxy resin, filled between the component 6 and the substrate 13 while a resin 9 is filled between the active component 8 and the substrate 13. The component 6 and the active component 8 are encapsulated with a resin molding 12 on the upper surface 13A of the ceramic substrate 13 having the components 6 and 8 mounted thereon.

Since the internal electrodes 2 and the via-electrodes 3 in the ceramic substrate 13 are baked simultaneously together with the ceramic substrate 13 and are conductive, the electrodes are made of Ag paste having a large conductivity. The ceramic base 14 of the ceramic substrate 13 including the internal electrodes 2 of Ag is preferably baked substantially at 900° C. The ceramic base 14 may be made preferably of glass-ceramic mixture of $Al_2O_3$ and glass. The materials of the internal electrodes 2 and the ceramic substrate 13 are not limited to the foregoing materials.

The resin molding 12 is made of electrically-insulating resin material, such as epoxy, phenol, or epoxy-silicone resin, and secures a bonding strength and a resistance against impact of the components 6 and 8 in the module 1. The solders 7 may be replaced by electrically-conductive adhesives made of conductive resin.

The component 6 and the active component 8 are mounted and electrically connected on the ceramic substrate 13. After the component 6 is placed on the ceramic substrate 13 and connected to the land electrodes 4, the space 10C including the recess 10B between the component 6 and the ceramic substrate 13 is filled with the resin 11. The recess 10B enables the resin 11 to be easily filled between the component 6 and the ceramic substrate 13. This arrangement produces no gap between the component 6 and the ceramic substrate 13, and the solders 7 can be prevented from flowing when the solders are heated while the module 1 is mounted on the mother board 40, thus preventing the electrodes 4 from short circuit. Particularly if the component 6 has such a small size that the electrodes 4 is spaced a little from each other, the recess 10B is useful for receiving the resin 11.

For improving a bonding strength and reliability of the component 8 for the surface mounting, the resin 9 of insulating resin material, such as epoxy resin, is often applied between the component 8 and the substrate 13. The resin 9 may be made of material selected from various resins. The recess 10A allows the resin 9 to be filled between the component 8 and the substrate 13 even if the distance between the component 8 and the substrate 13 is small. This arrangement produces no gap between the component 8 and the substrate 13, hence providing the ceramic module 1 with large bonding strength and reliability for the surface mounting.

In order to fill spaces beneath the components 6 and 8 with the resins 11 and 9 at stably, a distance W1 between the land electrodes 4 of the component 6 or 8 and a distance W2 of the recess 10B or 10A satisfy $W1 \geq W2$ as shown in FIG. 2, and depths of the recess 10B and 10A are preferably not smaller than 10 μm. This arrangement prevents the solders or the conductive adhesive for mounting the component 6 or 8 on the substrate 13 from causing short-circuit between the electrodes 4 due to the flowing of the solder or adhesive, and prevents the resin 11 and 9 from being applied with insufficient amounts beneath the component 6 or 8. Accordingly, the ceramic module 1 has large bonding strength and reliability for the surface mounting of the components 6 and 8.

FIGS. 3 to 13 are cross sectional views of the ceramic substrate 13 for illustrating a procedure of manufacturing the substrate 13.

The ceramic substrate 13 is formed by baking a green sheet of glass ceramic material, such as mixture of $Al_2O_3$ and glass powder. The glass powder is preferably selected from $SiO_2$, $B_2O_3$, $Al_2O_3$, $CaCO_3$, $SrCO_3$, $SrCO_3$, $BaCO_3$, $La_2O_3$, $ZrO_2$, $TiO_2$, $MgO$, $PbO$, $ZnO$, $Li_2O_3$, $Na_2CO_3$, and $K_2CO_3$. The mixture of $Al_2O_3$ and glass powder is added with poly vinyl butylal binder, plasticizer, and organic solvent for dispersion, thus providing slurry. The above described composition is illustrative, and may be replaced with any other appropriate example for providing slurry.

Figure 3:
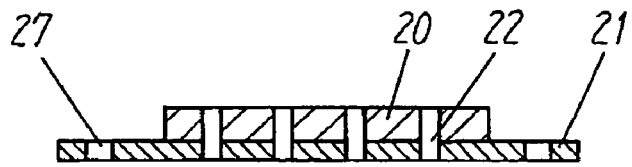
FIG. 3 is a cross sectional view of the module for illustrating a method of manufacturing the module according to the embodiment.

The slurry is applied on a base film 21 made of, for example, PET material with a doctor blade or the like, and is dried, thus providing a ceramic green sheet 20 having predetermined desired thickness and size, as shown in FIG. 3. The base film 21 is not limited to the PET material but may be made of any other appropriate material.

Figure 4:
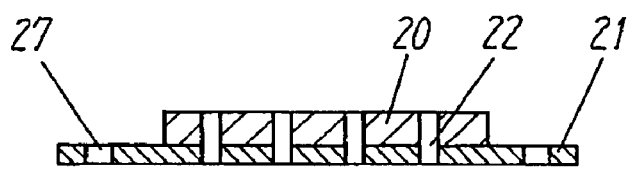
FIG. 4 is a cross sectional view of the module for illustrating the method of manufacturing the module according to the embodiment.

Next, the green sheet 20 is perforated by punching or laser beam machining to have through-holes 22 formed therein, as shown in FIG. 4. Pilot holes 27 may be provided in the base film 21 for multi-layer assembly if necessary.

Figure 5:
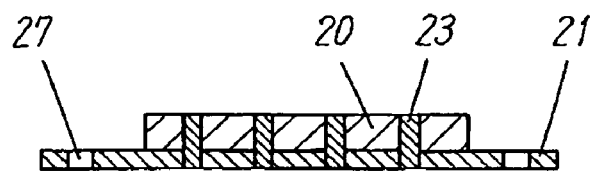
FIG. 5 is a cross sectional view of the module for illustrating the method of manufacturing the module according to the embodiment.
Figure 6:
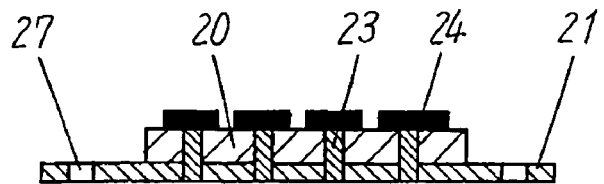
FIG. 6 is a cross sectional view of the module for illustrating the method of manufacturing the module according to the embodiment.

The through-holes 22 are then filled with silver paste to develop via-electrodes 23, as shown in FIG. 5. Then, a pattern of the internal electrodes 24 are formed by, for example, screen printing, as shown in FIG. 6. The internal electrodes 24 are patterned with paste made of Ag-based conductive material, however the paste may be made of any conductive material other than the Ag-based material which can be baked simultaneously with the green sheet 20.

Figure 7:
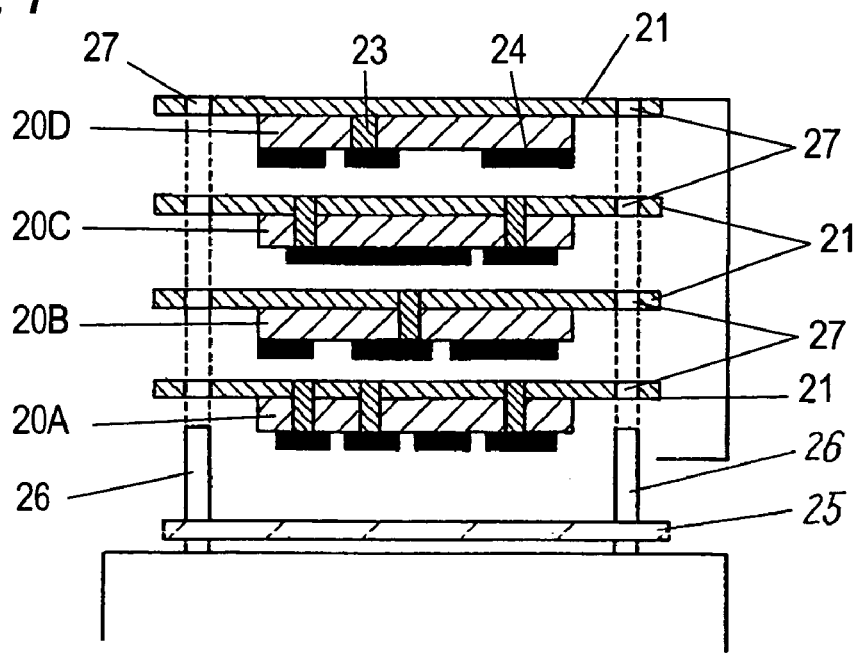
FIG. 7 is a cross sectional view of the module for illustrating the method of manufacturing the module according to the embodiment.

The base films 21 having green sheets 20A-20D, the via electrodes 23, and the internal electrodes 24 are aligned by inserting guide pins through the pilot holes 27, as shown in FIG. 7. Then, the green sheet 20A is placed on a stack pallet 25. Then, the green sheet 20B is placed on the green sheet 20A on the stack pallet 25 while pilot holes 27 aligned with the guide pins 26 inserted. Then, similarly, the green sheet 20C is stacked on the green sheet 20B, and the green sheet 20D is stacked on the green sheet 20C.

Figure 8:
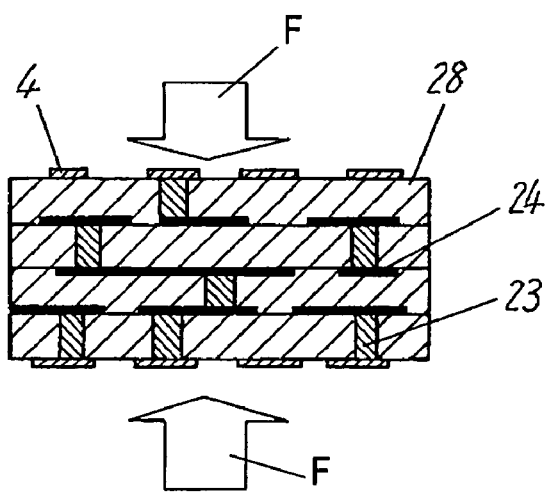
FIG. 8 is a cross sectional view of the module for illustrating the method of manufacturing the module according to the embodiment.

As above, a multi-layer block 28 including the green sheets 20A-20D is provided, as shown in FIG. 8. The land electrodes 4 are provided on the upper surface of the multi-layer block 28. The pilot holes 27 are provided in the base film 21 according to the embodiment, however, may be provided in the green sheets 20A-20D. Then, pressures F are applied to the multi-layer block 28 for having the green sheets 20A-20D have an uniform density and for eliminating de-lamination between any adjacent ones of the green sheets 20A-20D. Accordingly, the green sheets 20A-20D are pressed and joined together.

Figure 9:
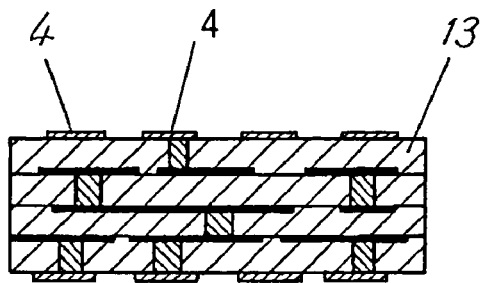
FIG. 9 is a cross sectional view of the module for illustrating the method of manufacturing the module according to the embodiment.

The multi-layer block 28 is then degreased at a temperature ranging from 350° C. to 600° C., and baked at a temperature ranging from 850° C. to 950° C., hence providing the ceramic substrate 13 including the internal electrodes 24 of the Ag-based material, as shown in FIG. 9.

Figure 10:
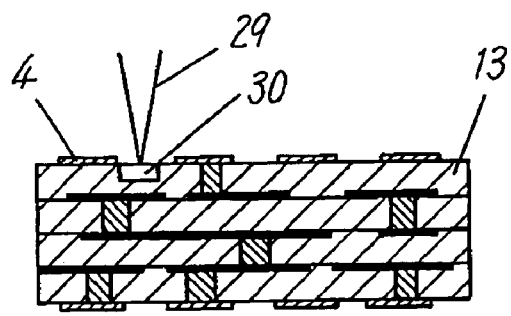
FIG. 10 is a cross sectional view of the module for illustrating the method of manufacturing the module according to the embodiment.

Then, a recess 30 is formed by applying laser beam 29 at a portion of the ceramic substrate 13 between the land electrodes 4, as shown in FIG. 10. The laser beam 29 forms the recess 30 in a short period of time.

The end electrodes 15 of the component 6 are connected to the electrodes 4 with solders 7. Then, the recess 30 is filled with the resin 11, such as epoxy resin or silicone resin, and the resin 11 is cured. This allows the resin 11 filled in the recess 30 to prevents short-circuit between the electrodes 4 since the resin prevents the solders 7 from flowing between the electrodes 4 when being heated for mounting another component on the substrate 13 at a succeeding step.

In order to mount the component 8, a recess 30 is formed at beneath the component 8 and in the substrate 13, and filled with the resin 9 for improving the bonding strength and reliability of the mounting. This arrangement allows the resin 9 to be filled and cured between the component 8 and the substrate 13 with producing of no gap, hence contributing to the improvement in the bonding strength and operational reliability of the ceramic module 1.

Figure 11:
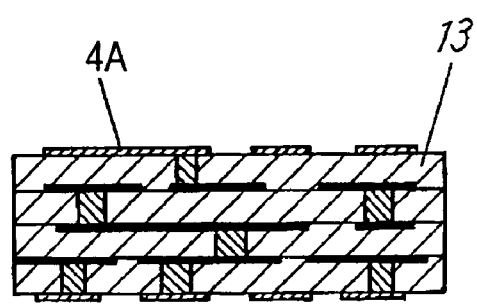
FIG. 11 is a cross sectional view of the module for illustrating the method of manufacturing the module according to the embodiment.
Figure 12:
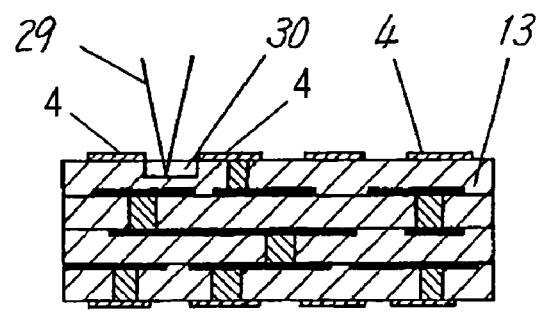
FIG. 12 is a cross sectional view of the module for illustrating the method of manufacturing the module according to the embodiment.

As shown in FIG. 11, for forming the land electrodes 4, a land electrode 4A having a large size may be formed on the ceramic substrate 13, and is then baked. Then, the land electrode 4A is divided into the electrodes 4 at the same time when the recess 30 is formed by the laser beam 29 in the substrate 13, as shown in FIG. 12. That is, the electrodes 4 and the recess 30 can be formed simultaneously. This operation allows the recess 30 to be formed precisely between the land electrodes 4 without consideration of thinning of the conductive paste or accuracy of the patterning even when the land electrodes 4 have small sizes.

Figure 13:
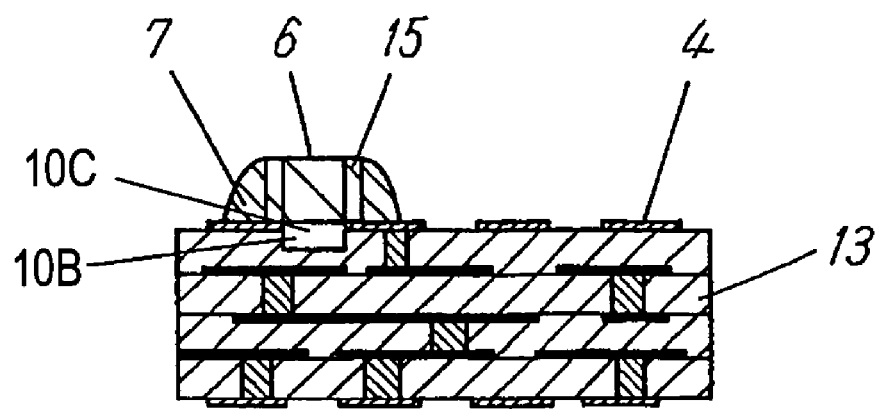
FIG. 13 is a cross sectional view of the module for illustrating the method of manufacturing the module according to the embodiment.

Then, the component 6 and the active component 8 (not shown) are mounted while the resin 11 is filled in the recess 30 as well as beneath the component 6, as shown in FIG. 13. They are molded with a resin molding 12 and cut by dicing into the ceramic modules 1 having a predetermined size.

The electrodes 4 and 4A may be baked together with the ceramic substrate 13 or after the ceramic substrate 13 is baked.

Figure 14:
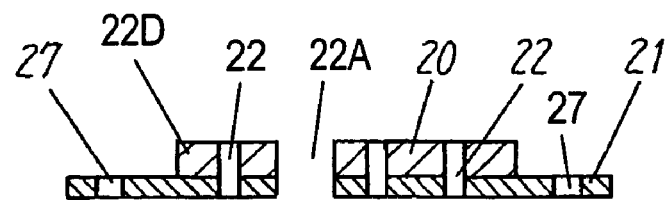
FIG. 14 is a cross sectional view of the module for illustrating another method of manufacturing the module according to the embodiment.
Figure 15:
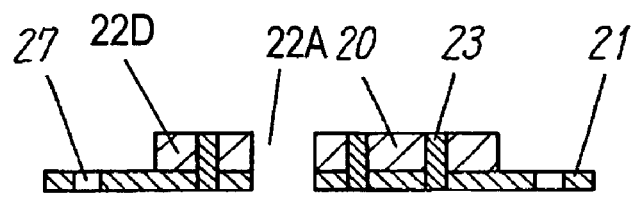
FIG. 15 is a cross sectional view of the module for illustrating the another method of manufacturing the module according to the embodiment.
Figure 16:
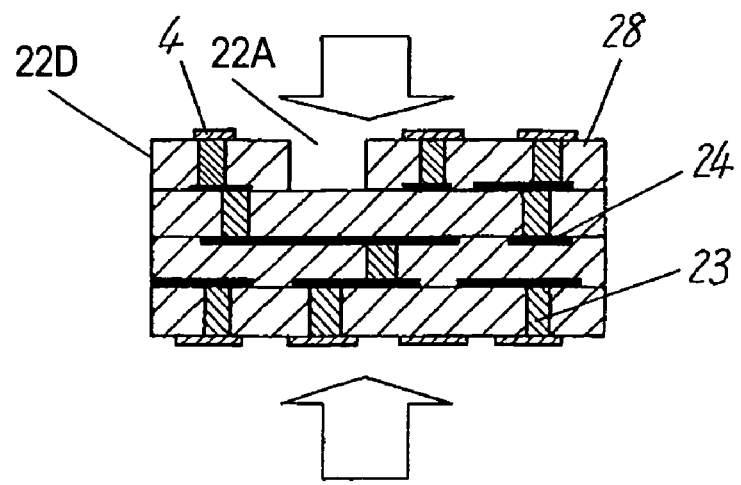
FIG. 16 is a cross sectional view of the module for illustrating the another method of manufacturing the module according to the embodiment.

FIGS. 14 to 16 are cross sectional views of the ceramic module for illustrating another method for manufacturing the module according to the embodiment. When the through-holes 22 are formed in the green sheet shown in FIG. 4 by punching or laser beam, a though-hole 22A may be formed in the green sheet 20D, which is to be placed at the outermost layer, at a portion where the recesses 10A and 10B is to be provided, as shown in FIG. 14. Then, similarly to processes illustrated in FIGS. 5-11, the via-electrodes 23 is formed in the through-holes 22, as shown in FIG. 15, and the internal electrodes 24 are formed, as shown in FIG. 16. Then, the green sheets 20A-20D are stacked and baked. That is, the through-hole 22A serves as the recesses 10A and 10B in the multi-layer block 28. Then, the components 6 and 8 are mounted, as shown in FIG. 13, and the resins 9 and 10 are then applied. Finally, they are encapsulated in the resin molding 12, thus providing the ceramic module 1. According to the above method, the recesses 10A and 10B can be provided without forming recesses after the green sheets 20A-20D are baked.

The recess 30 may be formed in the multi-layer block 28 by laser beam machining before the block is baked. After the baking of the multi-layer block 28, the components 6 and 8 are mounted, the resins 9 and 11 are applied, and the resin molding 12 is provided, thus providing the ceramic module 1.

Figure 17:
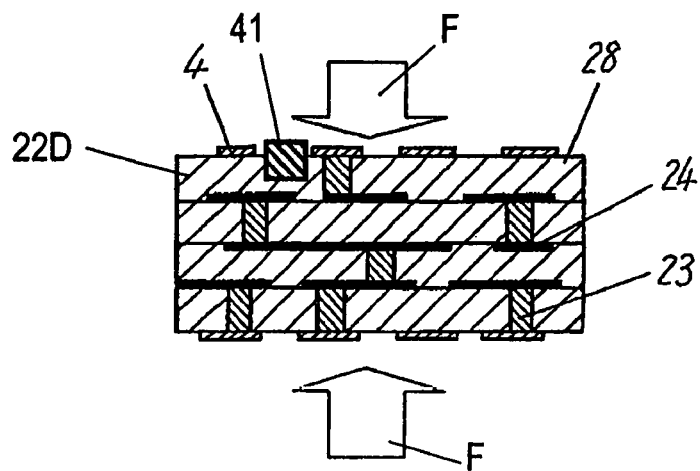
FIG. 17 is a cross sectional view of the module for illustrating a further method of manufacturing the module according to the embodiment.
Figure 18:
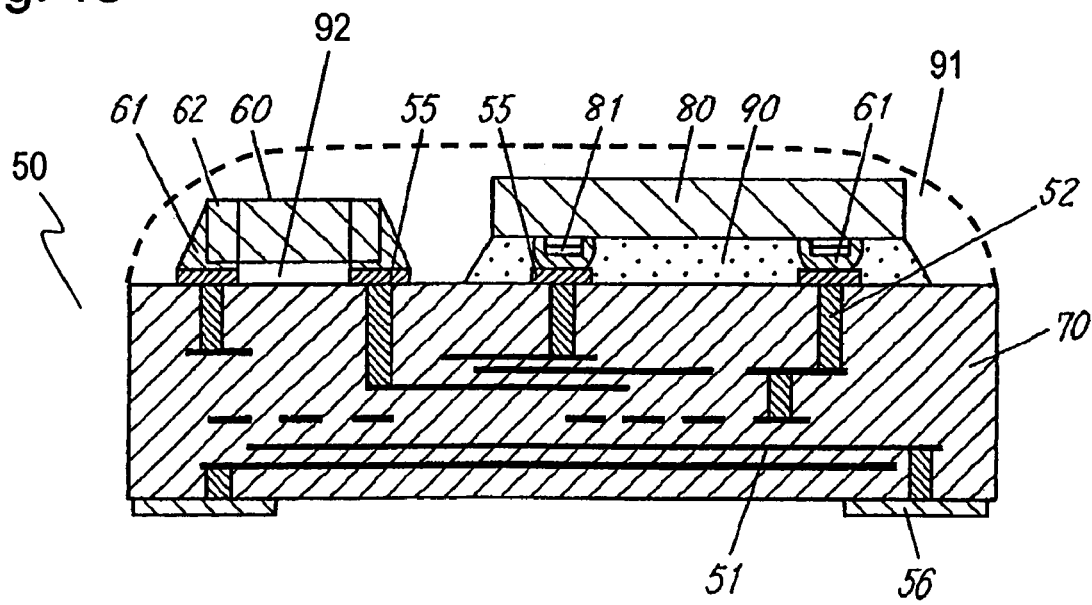
FIG. 18 is a cross sectional view of a conventional ceramic module.

As shown in FIG. 17, the recess 30 between the land electrodes 4 may be formed by locating a die 41 between the land electrodes 4 and pressing the die downwardly while the multi-layer block 28 is pressed. Alternatively, as shown in FIG. 12 the recess 30 may be formed by laser beam between the land electrodes 4. The recess 30 can be formed before and after the pressing of the block. After the baking of the multi-layer block 28, the components 6 and 8 are mounted, the resins 9 and 11 are applied, and the resin molding 12 is formed, thus providing the ceramic module 1 having the recesses 10A and 10B between the land electrodes 4 readily and easily.

What is claimed is:

1. A method of manufacturing a module, comprising:
providing a ceramic substrate having a first surface thereof having a recess formed in the first surface of the ceramic substrate, wherein the first surface of the ceramic substrate surrounds an entire outer periphery of the recess;
providing a first electrode and a second electrode on the first surface of the ceramic substrate, wherein the recess is located between the first electrode and the second electrode;
providing a component including a main body and a third electrode and a fourth electrode;
providing the component over the recess of the ceramic substrate and connecting the third electrode and the fourth electrode to the first electrode and the second electrode, respectively, so that a space including the recess is provided between the component and the ceramic substrate; and
filling the space between the component and the ceramic substrate with a resin.

2. The method according to claim 1, further comprising covering the component and the first surface of the ceramic substrate with a resin molding.

3. The method according to claim 1, wherein the recess has a depth not smaller than 10 μm.

4. The method according to claim 1, wherein the ceramic substrate has a second surface thereof, said method further comprising
providing a fifth electrode on the second surface of the ceramic substrate.

5. The method according to claim 1, wherein said providing the ceramic substrate comprises:
baking a ceramic green sheet having a first surface corresponding to the first surface of the ceramic substrate; and
forming the recess in the first surface of the baked ceramic green sheet.

6. The method according to claim 5, wherein said forming the recess in the first surface of the baked ceramic green sheet comprises forming the recess in the first surface of the baked ceramic green sheet with laser beam.

7. The method according to claim 1, wherein said providing the ceramic substrate having the first surface thereof having the recess formed in the first surface comprises forming the recess in the first surface of the ceramic substrate, and
wherein said providing the first electrode and the second electrode on the first surface of the ceramic substrate comprises:
providing a fifth electrode on a portion of the first surface of the ceramic substrate where the first electrode and the second electrode are to be provided; and
dividing the fifth electrode so as to provide the first electrode and the second electrode simultaneously to said forming the recess in the first surface of the ceramic substrate.

8. The method according to claim 1, wherein said providing the ceramic substrate comprises:
providing a first ceramic green sheet having a first surface and a second surface opposite to the first surface of the first ceramic green sheet, the first surface corresponding to the first substrate of the ceramic substrate;
forming a certain recess in the first surface of the first ceramic green sheet, the certain recess corresponding to the recess provided in the ceramic substrate; and
baking the first ceramic green sheet having the certain recess formed therein.

9. The method according to claim 8, wherein said forming the certain recess in the first surface of the first ceramic green sheet comprises forming the certain recess in the first surface of the first ceramic green sheet with laser beam.

10. The method according to claim 8, wherein said providing the ceramic substrate further comprises stacking a second ceramic green sheet on the second surface of the first ceramic green sheet having the certain recess formed in the first surface thereof, and
wherein said baking the first ceramic green sheet having the certain recess comprises baking the first ceramic green sheet having the second ceramic green sheet stacked thereon.

11. The method according to claim 8, wherein said providing the ceramic substrate further comprises
stacking a second ceramic green sheet on the second surface of the first ceramic green sheet to provide a multi-layer block, and
applying a pressure to the multi-layer block to join the first ceramic green sheet to the second ceramic green sheet, and
wherein said forming the certain recess in the first surface of the first ceramic green sheet comprises forming the certain recess in the first surface of the first ceramic green sheet simultaneously to said applying the pressure to the multi-layer block to join the first ceramic green sheet to the second ceramic green sheet.

12. The method according to claim 1, wherein said providing the ceramic substrate comprises:
providing a first ceramic green sheet having a first surface and a second surface opposite to the first surface of the first ceramic green sheet, the first surface of the first ceramic green sheet corresponding to the first surface of the ceramic substrate;
forming a first through-hole in the first ceramic green sheet from the first surface to the second surface of the first ceramic green sheet;
forming a second through-hole in the first ceramic green sheet from the first surface to the second surface of the first ceramic green sheet, the second through-hole being positioned at a portion where the recess is to be provided;
filling the first through-hole with electrically-conductive paste;
stacking a second ceramic green sheet on the second surface of the first ceramic green sheet to provide a multi-layer block; and
baking the multi-layer block.

13. The method according to claim 12, wherein said forming the first through-hole in the first ceramic green sheet comprises forming the first through-hole in the first ceramic green sheet by punching, and
wherein said forming the second through-hole in the first ceramic green sheet comprises forming the second through-hole in the first ceramic green sheet by punching.

14. The method according to claim 12, wherein said forming the first through-hole in the first ceramic green sheet comprises forming the first through-hole in the first ceramic green sheet by laser beam, and
wherein said forming the second through-hole in the first ceramic green sheet comprises forming the second through-hole in the first ceramic green sheet by laser beam.

15. A method of manufacturing a module, comprising:
providing a ceramic substrate having a first surface thereof having a recess formed in the first surface of the ceramic substrate;
providing a first electrode and a second electrode on the first surface of the ceramic substrate, wherein the recess is located between the first electrode and the second electrode;
providing a component including a main body and a third electrode and a fourth electrode;
providing the component over the recess of the ceramic substrate and connecting the third electrode and the fourth electrode to the first electrode and the second electrode, respectively, so that a space including the recess is provided between the component and the ceramic substrate; and
filling the space between the component and the ceramic substrate with a resin,
wherein said providing the ceramic substrate comprises:
providing a first ceramic green sheet having a first surface and a second surface opposite to the first surface of the first ceramic green sheet, the first surface corresponding to the first substrate of the ceramic substrate;
forming a certain recess in the first surface of the first ceramic green sheet, the certain recess corresponding to the recess provided in the ceramic substrate; and
baking the first ceramic green sheet having the certain recess formed therein.

16. The method according to claim 15, further comprising covering the component and the first surface of the ceramic substrate with a resin molding.

17. The method according to claim 15, wherein the recess has a depth not smaller than 10 µm.

18. The method according to claim 15, wherein the ceramic substrate has a second surface thereof, said method further comprising
providing a fifth electrode on the second surface of the ceramic substrate.

19. The method according to claim 15, wherein said providing the first electrode and the second electrode on the first surface of the ceramic substrate comprises:

providing a fifth electrode on a portion of the first surface of the ceramic substrate where the first electrode and the second electrode are to be provided; and dividing the fifth electrode so as to provide the first electrode and the second electrode simultaneously to said forming the certain recess in the first surface of the ceramic substrate.

20. The method according to claim 15, wherein said forming the certain recess in the first surface of the first ceramic green sheet comprises forming the certain recess in the first surface of the first ceramic green sheet with laser beam.

21. The method according to claim 15, wherein said providing the ceramic substrate further comprises stacking a second ceramic green sheet on the second surface of the first ceramic green sheet having the certain recess formed in the first surface thereof, and wherein said baking the first ceramic green sheet having the certain recess comprises baking the first ceramic green sheet having the second ceramic green sheet stacked thereon.

22. The method according to claim 15, wherein said providing the ceramic substrate further comprises:

stacking a second ceramic green sheet on the second surface of the first ceramic green sheet to provide a multi-layer block, and applying a pressure to the multi-layer block to join the first ceramic green sheet to the second ceramic green sheet, and wherein said forming the certain recess in the first surface of the first ceramic green sheet comprises forming the certain recess in the first surface of the first ceramic green sheet simultaneously to said applying the pressure to the multi-layer block to join the first ceramic green sheet to the second ceramic green sheet.

* * * * *